United States Patent
Akita et al.

Patent Number: 6,089,185
Date of Patent: Jul. 18, 2000

[54] THIN FILM FORMING APPARATUS

[75] Inventors: Noritaka Akita, Kanagawa, Japan; Masayasu Suzuki, Hampshire, United Kingdom; Yoshihiro Hashimoto, Kanagawa, Japan

[73] Assignee: Shimadzu Corporation, Kyoto, Japan

[21] Appl. No.: 09/210,477

[22] Filed: Dec. 14, 1998

[30] Foreign Application Priority Data

Dec. 30, 1997 [JP] Japan ..................................... 9-369534

[51] Int. Cl.[7] .............................. C23C 16/00; C23F 1/02
[52] U.S. Cl. ............................ 118/723 R; 118/723 MW; 118/728; 156/345; 204/298.16; 204/298.36
[58] Field of Search ...................... 118/723 R, 723 MW, 118/723 ME, 723 MA, 723 MR, 723 I, 723 IR, 723 AN, 728, 500; 156/345; 204/298.06, 298.16, 298.25, 298.26, 298.35, 298.37, 298.38

[56] References Cited

U.S. PATENT DOCUMENTS

| | | | |
|---|---|---|---|
| 5,458,687 | 10/1995 | Shichida et al. | 118/724 |
| 5,685,913 | 11/1997 | Hirose et al. | 118/723 MA |
| 5,792,272 | 8/1998 | Van Os et al. | 118/723 ER |
| 5,961,773 | 10/1999 | Ichimura et al. | 156/345 |
| 5,983,829 | 11/1999 | Suzuki | 118/723 MW |
| 6,033,478 | 3/2000 | Kholodenko | 118/500 |

*Primary Examiner*—Thi Dang
*Assistant Examiner*—Luz Alejandro
*Attorney, Agent, or Firm*—Kanesaka & Takeuchi

[57] ABSTRACT

A thin film forming apparatus is formed of a vacuum chamber, a base plate holder for holding a base plate near a central part of the vacuum chamber, and ECR plasma generating devices respectively connected to both side portions of the vacuum chamber. A magnetic field generating device is situated adjacent to the vacuum chamber for generating a predetermined magnetic field in the vacuum chamber, and a gas introducing system is connected to the vacuum chamber for introducing a reaction gas into the vacuum chamber. Since the base plate holder has a shape corresponding to an external shape of the base plate, a distance between the base plate and the base plate holder is uniform. The films with uniform thicknesses can be formed on both surfaces of the base plate.

8 Claims, 3 Drawing Sheets

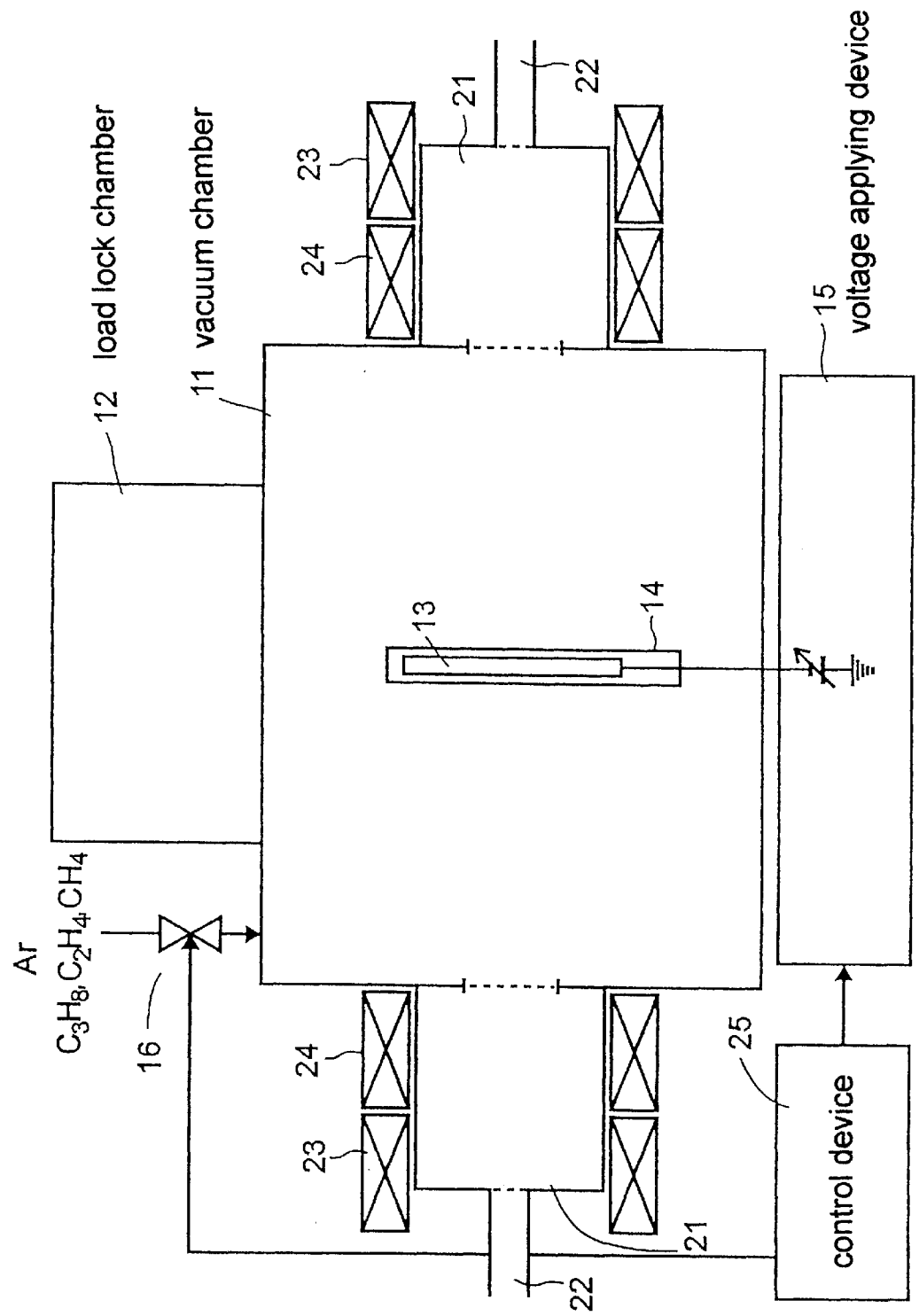

500

THIN FILM FORMING APPARATUS

BACKGROUND OF THE INVENTION AND RELATED ART STATEMENT

The present invention relates to a thin film forming apparatus, and more specifically, the invention relates to a thin film forming apparatus by a plasma chemical vapor deposition (hereinafter referred to as CVD), which is suitable for manufacturing a magnetic disc.

A magnetic disc for a hard disc memory is normally made by forming a magnetic layer on a disc, such as a glass, and further providing a protection layer thereon. Conventionally, the protection layers are formed as carbonaceous protection films simultaneously on both surfaces of the disc by using a thin film forming apparatus by sputtering. However, as a new market demand, carbonaceous protection films formed by using a film forming method by a CVD method rather than a sputtering method have been requested.

However, in case the thin films are formed by a plasma CVD apparatus, the thicknesses of the formed films vary in accordance with the shape of a base plate (disc) holder. Therefore, there is a problem that a uniform film thickness can not be obtained.

Namely, conventionally, several uneven film thickness portions are formed partially in a disc 13 as shown in FIG. 4(b). The shape of a conventional base plate holder is one of the reasons of this problem. In particular, since a conventional base plate holder 18 is substantially rectangular as shown in FIG. 5, spaces between the disc 13, i.e. the base plate, and the base plate holder 18 are unequal as shown as A and B in FIG. 5. Corresponding to the vicinity of the portion A where a space between the base plate and the base plate holder is large, there is formed a portion in which a film forming speed is fast, that is, a thick film portion 34 where a thickness of the formed film is large.

In view of the above problem, an object of the invention is to provide a thin film forming apparatus by a plasma CVD, wherein a thin film with an equal thickness can be formed on surface of the base plate.

Another object of the invention is to provide a thin film forming apparatus as stated above, wherein the thin films with an equal thickness can be formed on both surfaces of the base plate at the same time.

Further objects and advantages of the invention will be apparent from the following description of the invention.

SUMMARY OF THE INVENTION

To achieve the aforementioned objects, the present invention provides a thin film forming apparatus which is provided with a vacuum chamber; a base plate holder which holds a base plate in a vicinity of a center of the vacuum chamber and has a shape corresponding to an external shape of the base plate; electron cyclotron resonance (ECR) plasma generating means respectively connected to both side surfaces of the vacuum chamber; magnetic field generating means for generating a predetermined magnetic field in the vacuum chamber; gas introducing means for introducing an inert gas and a reaction gas into the vacuum chamber; and voltage applying means for applying a negative voltage to the base plate held in the vacuum chamber.

The base plate holder has a shape corresponding to the external shape of the base plate, so that spaces between the holder and the base plate held therein are constant substantially in all the portions. Accordingly, passages of plasma ions generated on both the side surfaces of the base plate are uniform, so that spatially equal plasma ions can be generated, and the thickness of the thin film formed on the entire surface of the base plate can be equalized.

BRIEF DESCRIPTION OF THE DRAWINGS

FIG. 3 is a block diagram showing an entire thin film forming apparatus according to the embodiment of the invention;

DETAILED DESCRIPTION OF THE PREFERRED EMBODIMENTS

Figure 1:
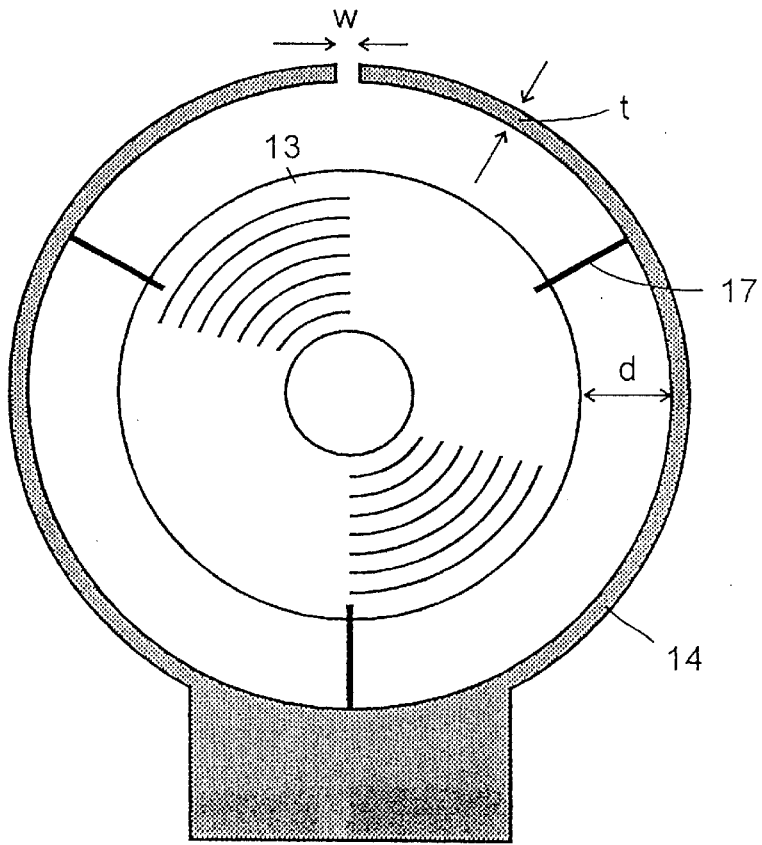
FIG. 1 is a front view showing a base plate holder according to an embodiment of the invention.
Figure 2:
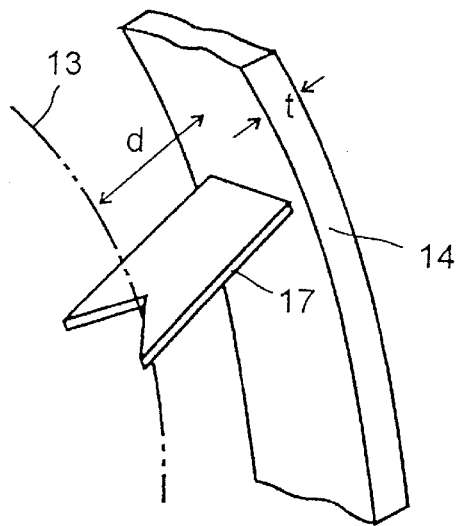
FIG. 2 is a schematic perspective view showing a part of the base plate holder.

Hereinafter, an embodiment of the present invention will be explained with reference to the attached drawings. In the embodiment of the present invention, as shown in FIGS. 1 and 2, a base plate holder 14 holds a base plate or disc 13, on which a thin film is to be formed, by means of pawls 17. The base plate holder 14 is ring-shaped to correspond to an external shape of the disc 13, and is formed such that an interval or distance d between the holder 14 and the disc 13 is uniform in all the areas thereof. The interval d is set to be approximately 3 mm to 50 mm. A slit formed at an upper end of the ring-shaped base plate holder 14 has a width of 5 mm or less. Further, a thickness t of the base plate holder 14 is set as thin as possible in a range that a strength permits. The pawls 17 are fixed to an inner surface of the base plate holder 14 as shown in FIG. 2. The disc 13 is held by fitting the disc 13 in the pawls 17.

FIG. 3 is a block diagram schematically showing an entire thin film forming apparatus by a plasma CVD according to the present invention. The base plate 13 held by the base plate holder 14 as described above is disposed in a vacuum chamber 11 which is exhausted in a vacuum state by an exhausting system, not shown. While being held by the base plate holder 14 as described above, the base plate 13 is transferred into the vacuum chamber 11 and brought out therefrom through a load lock chamber 12 disposed on a side surface of the vacuum chamber 11.

A negative DC voltage or a high frequency voltage is applied to the base plate 13 through the base plate holder 14 by a voltage applying device 15. The vacuum chamber 11 is connected to a gas introducing system 16, which is formed of a bomb, control valve and so on, for introducing an argon gas and a reaction gas into the vacuum chamber 11. Also, in this example, cavities 21 are connected to windows at both side surfaces, i.e. right and left sides in the figure, of the vacuum chamber 11. Waveguides 22 for introducing microwave are attached to the cavities 21, and magnetic coils 23, 24 are provided therearound, so that an electron cyclotron resonance (hereinafter referred to as ECR) plasma is generated in the cavities 21.

Namely, microwave of 2.45 GHz is introduced into the cavities 21 through the waveguides 22, and a magnetic field is formed simultaneously by the magnetic coils 23, 24, so that ECR is generated to form an active ECR plasma. The ECR plasma is drawn into the vacuum chamber 11 by a suitable magnetic field, such as a mirror magnetic field or a cusp magnetic field, formed in the vacuum chamber 11 by the magnetic coils 23, 24.

A control device 25 controls the voltage applying device 15 to control a voltage applied to the base plate 13, and also, opens and closes a valve of the gas introducing system 16 to introduce the gas into the vacuum chamber 11. Also, the control device 25 controls a power supply (not shown) for supplying electricity to the magnetic coils 23, 24 so as to control the generated magnetic field.

In case the protection layers are formed on both surfaces of the base plate 13 to produce a magnetic disc for a hard disc memory, a negative voltage is applied to the base plate 13, and a CnHm gas, i.e. hydrocarbon gas, or a mixed gas of an inert gas and a CnHm gas is introduced into the vacuum chamber 11. The CnHm gas is ionized by the ECR plasma, so that carbon ions and hydrogen ions are adhered to the base plate 13 to form the thin films thereon. By the ECR-CVD as described above, the carbonaceous films are formed on both the surfaces of the base plate 13. The carbonaceous films formed by the ECR-CVD are amorphous-like thin films, and are excellent in abrasion resistance, corrosion resistance, peel resistance, voltage-characteristic resistance, and insulation resistance. Accordingly, the films, which are extremely high in hardness while being thin and are optimum for the protection layers of the magnetic disc, can be formed.

Figure 4A:
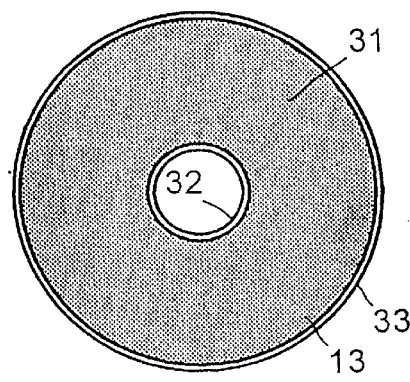
FIG. 4(a) is schematic view showing a thickness distribution of a thin film formed on a base plate according to the present invention.
Figure 4B:
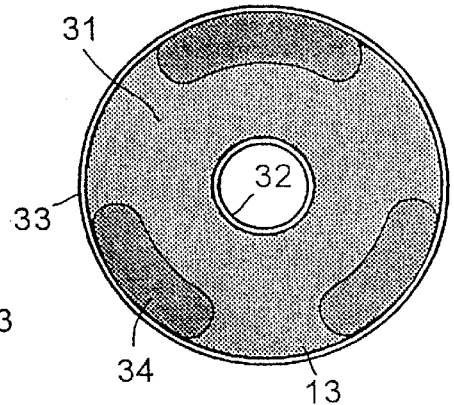
FIG. 4(b) is a schematic view showing a thickness distribution of a thin film formed on a base plate according to a conventional thin film forming apparatus.
Figure 5:
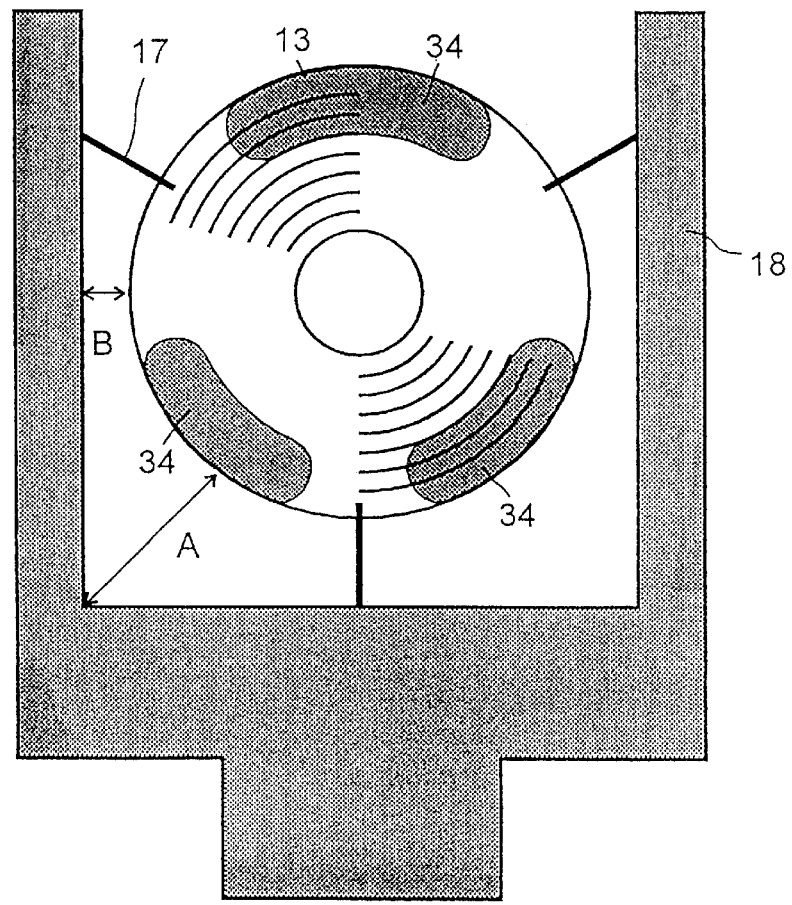
FIG. 5 is a front view showing a conventional base plate holder.

In case the films are formed on both the surfaces of the base plate 13 by the ECR-CVD as described above, as shown in FIG. 4(a), uniform film thickness portions 31 can be formed in most portions on both the surfaces of the base plate 13 except inner and outer edge portions 32, 33 having larger film thicknesses. Namely, the shape of the base plate holder 14 has a ring shape corresponding to the external shape of the disc 13 as the base plate as described above, the distance d between the base plate holder 14 and the disc 13 is uniform in all the portions, and the thickness t of the base plate holder 14 is made thin. In case the films are formed on both the surfaces of the base plate 13 by the ECR-CVD, plasma ions are generated on both the surfaces of the base plate 13. In this case, since the distance d of the space is uniform and the thickness t is small, the passages of the plasma ions become uniform, so that spatially uniform plasma ions can be generated with respect to the base plate 13. As a result, it is considered that the uniform thickness portion 31 can be formed in the base plate 13 as shown in FIG. 4(a).

Further, since the base plate holder 14 has a ring shape corresponding to the external shape of the disc 13 as the base plate and the distance d between the base plate holder 14 and the base plate 13 is uniform at any portions, the base plate holder 14 is symmetrical with respect to the central axis of the disc 13, and this factor also contributes to equalizing the film thickness. Namely, the plasma expands in Gaussian distribution, resulting in expanding equally as long as there is no physical obstacle in the vacuum chamber 11. Since the central axis of the disc 13 substantially corresponds to a central axis of the plasma, the film thickness distribution can be equalized by forming the base plate holder 14 in the axially symmetrical shape.

Incidentally, the above description is an explanation for one example, and it is needless to say that the present invention is not limited to the above structure. For example, the shape of the pawl 17 is not limited to the shape shown in the figures. Also, needless to say, the present invention can achieve not only the case where the protection layers are simultaneously formed on both the surfaces of the disc during the manufacturing process of the magnetic disc of the hard disc memory, but also the case where other thin films are formed on both surfaces of a general base plate.

As described above, according to the thin film forming apparatus of the invention, in case of simultaneously forming the films on both surfaces of the base plate by the ECR-CVD, the thin films with a uniform thickness can be formed. Since it is possible to form the films with the uniform thickness simultaneously on both the surfaces of the plate, efficient film forming can be achieved, so that cost therefor can be lowered. Especially, since the carbonaceous film formed by the ECR-CVD is excellent in abrasion resistance, corrosion resistance, peel resistance, voltage-characteristic resistance, and insulation resistance, it is optimum as the protection layer of the magnetic disc. Since such carbonaceous films with the uniform thickness can be formed efficiently and simultaneously on both the surfaces of the disc, it is suitable to use the films in the manufacturing process of the magnetic disc.

While the invention has been explained with reference to the specific embodiments of the invention, the explanation is illustrative and the invention is limited only by the appended claims.

What is claimed is:

1. A thin film forming apparatus comprising:
   a vacuum chamber,
   a base plate holder disposed in the vacuum chamber adapted to hold a base plate in a vicinity of a central part of the vacuum chamber, said base plate holder having a shape corresponding to an external shape of the base plate,
   ECR plasma generating means connected to side portions of the vacuum chamber, respectively, for generating plasma,
   magnetic field generating means situated adjacent to the vacuum chamber for generating a predetermined magnetic field in the vacuum chamber,
   gas introducing means connected to the vacuum chamber for introducing an inert gas and a reaction gas into the vacuum chamber, and
   voltage applying means for applying a negative voltage to the base plate held in the vacuum chamber so that thin films with a uniform thickness are formed on two surfaces of the base plate by the plasma generating means.

2. A thin film forming apparatus according to claim 1, wherein said base plate holder has a circular shape, and a distance between an outer periphery of the base plate and inner periphery of the base plate holder is substantially equal throughout the outer periphery of the base plate when the base plate is held in the base plate holder.

3. A thin film forming apparatus according to claim 2, wherein said ECR plasma generating means generates ECR plasma so that the reaction gas introduced into the chamber is ionized to generate ions, said ions being attached to said both surfaces of the base plate to form the thin films with the uniform thickness.

4. A thin film forming apparatus according to claim 3, wherein said base plate holder includes a plurality of engaging pieces for holding the base plate therein.

5. A thin film forming apparatus according to claim 4, further comprising control means connected to the voltage applying means for controlling the voltage applying means to adjust a voltage applied to the base plate, and connected to a valve of the gas introducing means for opening and closing the valve to introduce the gas into the vacuum chamber.

6. A thin film forming apparatus for forming a thin film on a circular base plate comprising: a vacuum chamber, a base plate holder disposed in the vacuum chamber and having a substantially annular shape to hold a circular base plate therein, ECR plasma generating means connected to at least one side portion of the vacuum chamber for generating plasma in the vacuum chamber, magnetic field generating means situated adjacent to the vacuum chamber for generating a predetermined magnetic field in the vacuum chamber, gas introducing means connected to the vacuum chamber for introducing a reaction gas into the vacuum chamber, and voltage applying means connected to the base plate holder for applying a voltage to the base plate through the base plate holder so that thin films with a uniform thickness are formed simultaneously on both surfaces of the base plate by the plasma generating means.

7. A thin film forming apparatus according to claim 6, wherein said base plate holder has two supporting portions with a slit therebetween, each of said supporting portions having a uniform size and arranged symmetrically relative to a central line thereof.

8. A thin film forming apparatus according to claim 7, wherein said base plate holder is situated in a center of the vacuum chamber.

* * * * *